(12) United States Patent　(10) Patent No.: US 9,922,924 B1
Shih　(45) Date of Patent: Mar. 20, 2018

(54) INTERPOSER AND SEMICONDUCTOR PACKAGE

(71) Applicant: Micron Technology, Inc., Boise, ID (US)

(72) Inventor: Shing-Yih Shih, New Taipei (TW)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 15/369,834

(22) Filed: Dec. 5, 2016

Related U.S. Application Data

(63) Continuation-in-part of application No. 15/342,124, filed on Nov. 3, 2016.

(51) Int. Cl.
　　H01L 23/498　(2006.01)
　　H01L 23/00　(2006.01)
　　H01L 21/48　(2006.01)

(52) U.S. Cl.
　　CPC .... H01L 23/49838 (2013.01); H01L 21/4857 (2013.01); H01L 23/49822 (2013.01); H01L 23/49866 (2013.01); H01L 24/16 (2013.01); H01L 2224/16235 (2013.01)

(58) Field of Classification Search
　　None
　　See application file for complete search history.

(56) References Cited

U.S. PATENT DOCUMENTS

| 8,946,884 | B2 | 2/2015 | Kwon et al. | |
| 2003/0234447 | A1* | 12/2003 | Yunus | H01L 23/49816 257/739 |
| 2006/0237855 | A1* | 10/2006 | Kroehnert | H01L 23/49816 257/779 |
| 2010/0044884 | A1* | 2/2010 | Zbrzezny | H01L 23/49811 257/779 |
| 2010/0263923 | A1* | 10/2010 | Kodani | H01L 21/4853 174/260 |
| 2015/0145131 | A1* | 5/2015 | Yoo | H01L 23/49811 257/738 |
| 2016/0064328 | A1 | 3/2016 | Kwon et al. | |

FOREIGN PATENT DOCUMENTS

TW　　I503946 B　　10/2015

* cited by examiner

Primary Examiner — Angel Roman (74) Attorney, Agent, or Firm — TraskBritt (57) ABSTRACT

An interposer and a semiconductor package including the interposer are provided. The interposer includes a first dielectric layer, a conductive pillar, a conductive ring, a solder bump, and a redistribution layer. The first dielectric layer has an upper surface and a lower surface. The conductive pillar and the conductive ring are partially embedded in the first dielectric layer. A portion of the conductive pillar protrudes from the lower surface of the first dielectric layer. The conductive ring surrounds the conductive pillar, and a portion of the conductive ring protrudes from the lower surface of the first dielectric layer. The solder bump is disposed on the lower surface of the first dielectric layer, wherein the portion of the conductive pillar and the portion of the conductive ring are embedded in the solder bump. The redistribution layer is disposed on the upper surface of the first dielectric layer.

20 Claims, 11 Drawing Sheets

INTERPOSER AND SEMICONDUCTOR PACKAGE

CROSS-REFERENCE TO RELATED APPLICATION

This application is a Continuation-in-part of U.S. application Ser. No. 15/342,124, filed on Nov. 3, 2016, which is herein incorporated by reference.

BACKGROUND

Field of Invention

The present disclosure relates to an interposer and a semiconductor package.

Description of Related Art

The semiconductor integrated circuit (IC) industry has experienced rapid growth. During the growth, size or geometry of the semiconductor devices has greatly decreased. The industry has recently been developing technology to enable vertical integration of semiconductor device, known generally as 2.5-dimensional (2.5D) packaging technology, for minimizing size of the semiconductor devices.

In the 2.5D packaging technology, TSV interposers are usually used for connecting electronic components to form semiconductor packages and are beneficial in minimizing the size of the semiconductor packages. However, methods for fabricating the TSV interposers are usually complex; thereby, the TSV interposers are costly. Accordingly, a novel interposer and a novel semiconductor package are both required.

SUMMARY

The present disclosure provides an interposer. The interposer includes a first dielectric layer, a conductive pillar, a conductive ring, a solder bump, and a redistribution layer. The first dielectric layer has an upper surface and a lower surface. The conductive pillar is partially embedded in the first dielectric layer, and a portion of the conductive pillar protrudes from the lower surface of the first dielectric layer. The conductive ring is partially embedded in the first dielectric layer and surrounds the conductive pillar, and a portion of the conductive ring protrudes from the lower surface of the first dielectric layer. The solder bump is disposed on the lower surface of the first dielectric layer, wherein the portion of the conductive pillar and the portion of the conductive ring are embedded in the solder bump. The redistribution layer is disposed on the upper surface of the first dielectric layer. In this interposer, both the conductive pillar and the conductive ring are embedded in the solder bump, and therefore the conductive ring can help the conductive pillar to support the solder bump.

In one embodiment, a portion of the first dielectric layer surrounds the conductive pillar to separate the conductive pillar and the conductive ring.

In one embodiment, the interposer further includes a conductive connector embedded in the first dielectric layer, wherein the conductive connector connects the conductive pillar and the conductive ring.

In one embodiment, a material of the conductive pillar is same as a material of the conductive ring.

In one embodiment, the redistribution layer includes a second dielectric layer and an interconnect structure embedded in the second dielectric layer.

In one embodiment, the conductive pillar penetrates through the first dielectric layer and is disposed in contact with the interconnect structure.

In one embodiment, the conductive ring penetrates through the first dielectric layer and is disposed in contact with the second dielectric layer.

In one embodiment, the conductive ring penetrates through the first dielectric layer and is disposed in contact with the interconnect structure.

In one embodiment, the interposer further includes a microbump disposed on the redistribution layer, wherein the microbump is disposed in contact with the interconnect structure.

In one embodiment, the conductive pillar has a surface coplanar with the upper surface of the first dielectric layer.

In one embodiment, the conductive ring has a surface coplanar with the upper surface of the first dielectric layer.

In one embodiment, a first height of the conductive pillar is larger than, equal to, or smaller than a second height of the conductive ring.

In one embodiment, a height of the conductive ring is larger than a thickness of the first dielectric layer.

In one embodiment, the conductive ring is circular ring-shaped, polygonal ring-shaped, or irregular ring-shaped.

In one embodiment, a material of the conductive pillar comprises copper, chromium, nickel, aluminum, gold, silver, tungsten, titanium, tin, platinum, palladium, titanium nitride (TiN), titanium tungsten (TiW), nickel vanadium (NiV), or chromium copper (CrCu).

In one embodiment, a material of the conductive ring comprises copper, chromium, nickel, aluminum, gold, silver, tungsten, titanium, tin, platinum, palladium, titanium nitride (TiN), titanium tungsten (TiW), nickel vanadium (NiV), or chromium copper (CrCu).

The present disclosure provides a semiconductor package. The semiconductor package includes the interposer described in any one of aforementioned embodiments, a microbump, and a chip. The microbump is disposed on the redistribution layer. The chip is disposed on the microbump, wherein the redistribution layer includes a second dielectric layer and an interconnect structure embedded in the second dielectric layer, and the microbump is disposed in contact with the interconnect structure.

It is to be understood that both the foregoing general description and the following detailed description are by examples, and are intended to provide further explanation of the invention as claimed.

BRIEF DESCRIPTION OF THE DRAWINGS

The disclosure can be more fully understood by reading the following detailed description of the embodiment, with reference made to the accompanying drawings as follows.

DETAILED DESCRIPTION

Reference will now be made in detail to the present embodiments of the disclosure, examples of which are illustrated in the accompanying drawings. Wherever possible, the same reference numbers are used in the drawings and the description to refer to the same or like parts.

The following embodiments are disclosed with accompanying diagrams for detailed description. For illustration clarity, many details of practice are explained in the following descriptions. However, it should be understood that these details of practice do not intend to limit the present disclosure. That is, these details of practice are not necessary in parts of embodiments of the present disclosure. Furthermore, for simplifying the drawings, some of the conventional structures and elements are shown with schematic illustrations.

It will be understood that when an element is referred to as being "on" another element, it can be directly on the other element or intervening elements may be present therebetween. Furthermore, relative terms, such as "lower" or "bottom" and "upper" or "top", may be used herein to describe one element's relationship to another element as illustrated in the Figures. It will be understood that relative terms are intended to encompass different orientations of the device in addition to the orientation depicted in the Figures.

Figure 1:
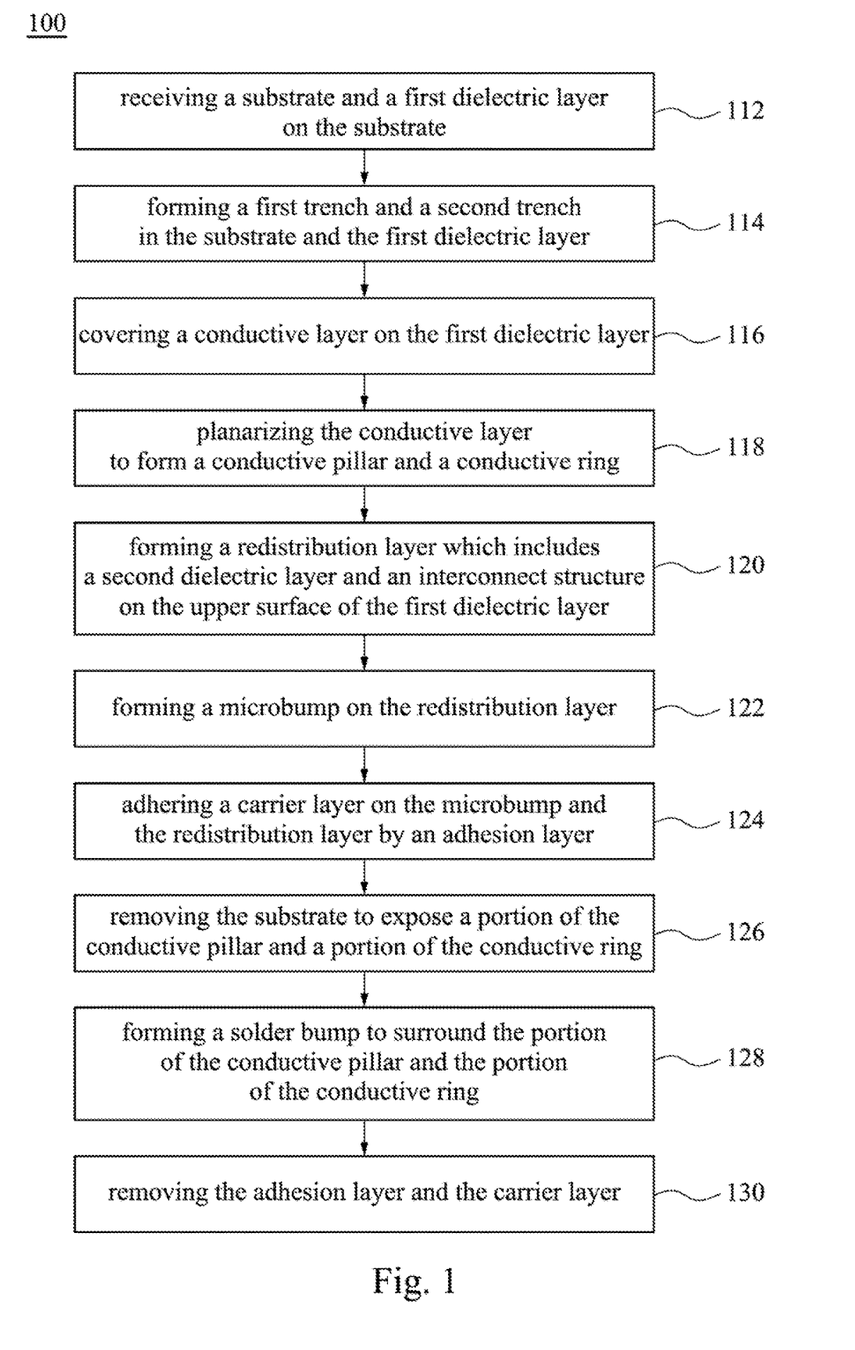
FIG. 1 is a flow chart of a method of fabricating an interposer shown in FIG. 11, in accordance with various embodiments.

Referring to FIG. 1 and FIGS. 2-11 at the same time. FIG. 1 shows a method 100 of fabricating an interposer 1100 shown in FIG. 11, in accordance with various embodiments. The method 100 includes operations 112-130. FIGS. 2-11 are cross-sectional views of the interposer 1100 at various stages of fabrication, in accordance with various embodiments. Although below using a series of operations described in this method disclosed, but the order of these operations shown should not be construed to limit the present disclosure. For example, certain operations may be performed in different orders and/or concurrently with other operations. Moreover, not all operations must be performed in order to achieve the depicted embodiment of the present disclosure. Furthermore, each operation described herein may contain several sub-steps.

Figure 2:
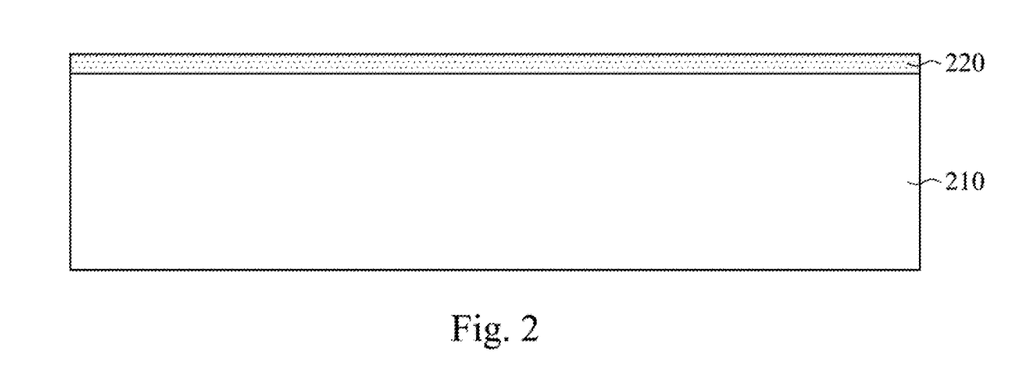
FIGS. 2-11 are cross-sectional views of the interposer at various stages of fabrication, in accordance with various embodiments.

In operation 112, a substrate 210 and a first dielectric layer 220 on the substrate 210 are received as shown in FIG. 2. In one embodiment, the substrate 210 includes Si, SiGe, SiGeC or SiC. In one embodiment, the dielectric layer 220 includes any suitable dielectric material or passivation material. These materials may be inorganic or organic. For instance, the dielectric layer 220 includes but is not limited to silicon dioxide ($SiO_2$), silicon nitride ($Si_3N_4$), silicon oxynitride (SiON), silicon carbide (SiC), polyimide (PI), and polybenzoxazole (PBO).

Figure 3:
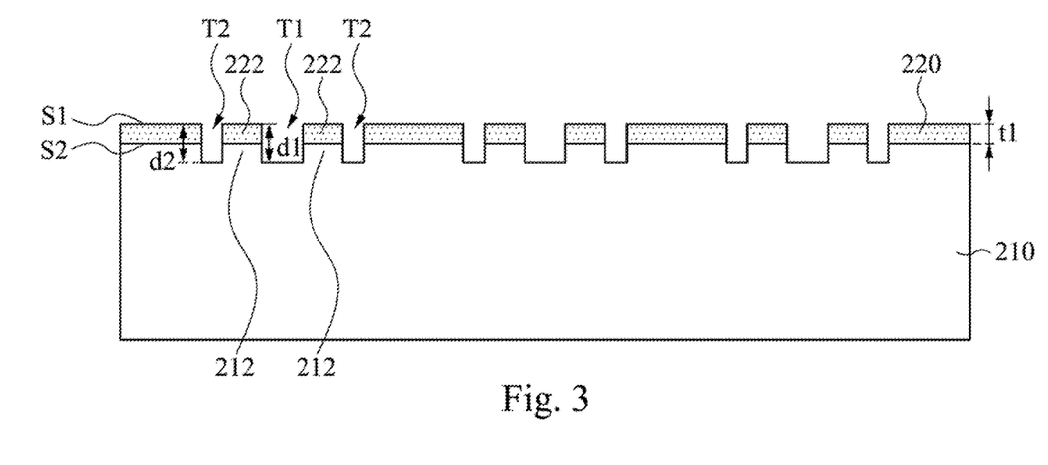

In operation 114, a first trench T1 and a second trench T2 are formed in the substrate 210 and the first dielectric layer 220 as shown in FIG. 3. In other words, a portion of the substrate 210 and a portion of the first dielectric layer 220 are removed to form the first trench T1 and the second trench T2. The second trench T2 is ring-shaped and thus surrounds the first trench T1. The ring-shaped may be circular ring-shaped, polygonal ring-shaped, or irregular ring-shaped. Although FIG. 3 only shows the cross-sectional views of the first trench T1 and the second trench T2, the shapes of the first trench T1 and the second trench T2 in top view can be further illustrated by top views of conductive layers filled in these trenches in subsequent descriptions, because the first trench T1 and the second trench T2 will be filled with the conductive layers in subsequent operations.

As shown in FIG. 3, the first dielectric layer 220 has an upper surface S1 and a lower surface S2. Both the first trench T1 and the second trench T2 extend from the upper surface S1 of first dielectric layer 220 to the interior of the substrate 210. In other words, both the first trench T1 and the second trench T2 penetrate through the first dielectric layer 220 and extend into the substrate 210. Moreover, because the second trench T2 surrounds the first trench T1, a portion 222 of the first dielectric layer 220 and a portion 212 of the substrate 210 would surround the first trench T1, and the second trench T2 would surround the portion 222 of the first dielectric layer 220 and the portion 212 of the substrate 210.

As shown in FIG. 3, the first trench T1 has a first depth d1, and the second trench T2 has a second depth d2. These trenches may be formed by any suitable etching methods, such as dry etching, wet etching, or laser drilling, such that the first depth d1 and the second depth d2 can be easily adjusted. By using various etching methods, the first depth d1 may be larger than, equal to, or smaller than the second depth d2. Furthermore, because both the first trench T1 and the second trench T2 penetrate through the first dielectric layer 220 and extend into the substrate 210, the first depth d1 and the second trench T2 is larger than a thickness t1 of the first dielectric layer 220.

Figure 4:
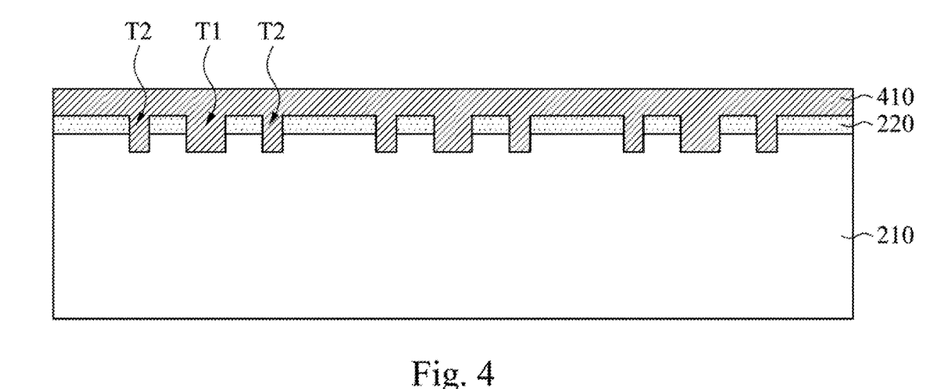

In operation 116, a conductive layer 410 is covered on the first dielectric layer 220 as shown in FIG. 4. Therefore, the first trench T1 and the second trench T2 are filled with the conductive layer 410. The conductive layer 410 may be made of any suitable conductive material. For instance, the conductive material is selected from metal materials which are usually used to manufacture an under bump metallurgy (UBM). In one embodiment, the conductive layer 410 is a single metal layer such as an adhesion layer, a barrier metals, a seed layer, or a wetting layer. Examples of the conductive material include but is not limited to copper, chromium, nickel, aluminum, gold, silver, tungsten, titanium, tin, platinum, palladium, titanium nitride (TiN), titanium tungsten (TiW), nickel vanadium (NiV), or chromium copper (CrCu). The conductive layer 410 may be formed by using electrolytic plating, electroless plating, evaporation, sputtering, printing, or other suitable metal deposition processes. In another embodiment, the conductive layer 410 is a multi-layer structure including a combination of an adhesion layer, a barrier layer, a seed layer, and a wetting layer. For instance, the conductive layer 410 includes the adhesion layer, the barrier layer, and the wetting layer, or includes a barrier layer and a seed layer.

Figure 5:
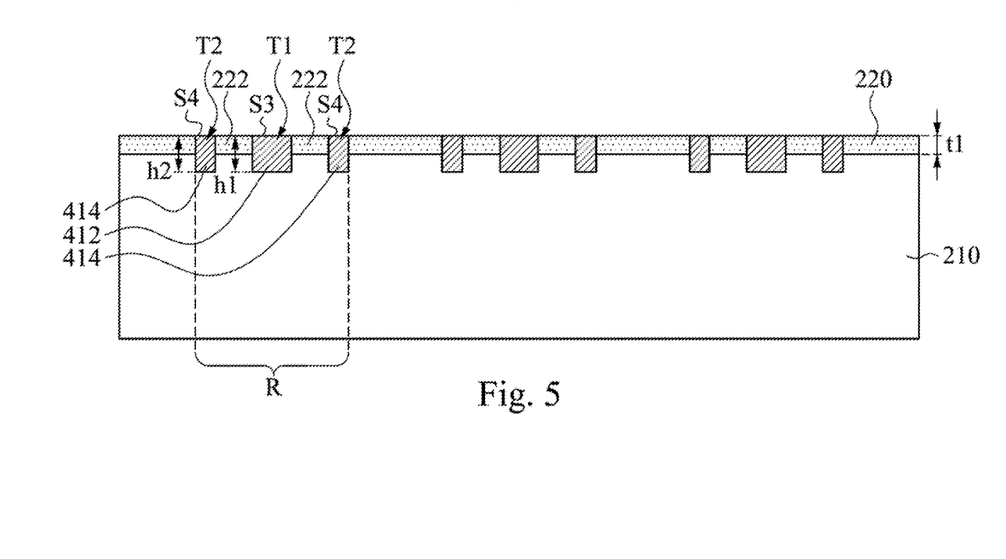

In operation 118, the conductive layer 410 is planarized to form a conductive pillar 412 and a conductive ring 414 as shown in FIG. 5. More specifically, the conductive pillar 412 is formed from the conductive layer 410 filled in the first trench T1, and the conductive ring 414 is formed from the conductive layer 410 filled in the second trench T2. Therefore, the shapes of the first trench T1 and the second trench T2 would determine the shapes of the conductive pillar 412 and the conductive ring 414. The conductive ring 414 is ring-shaped and surrounds the conductive pillar 412. The ring-shaped may be circular ring-shaped, polygonal ring-shaped, or irregular ring-shaped. Moreover, a first height h1 of the conductive pillar 412 is larger than, equal to, or smaller than a second height h2 of the conductive ring 414. Moreover, because both the first trench T1 and the second trench T2 penetrate through the first dielectric layer 220 and extend into the substrate 210, both the first height h1 of the conductive pillar 412 and the second height h2 of the conductive ring 414 are larger than the thickness t1 of the first dielectric layer 220.

Moreover, as shown in FIGS. 4-5, both the conductive pillar 412 and the conductive ring 414 are formed from the conductive layer 410. Therefore, both a material of the conductive pillar 412 and a material of the conductive ring 414 are same as the material of the conductive layer 410. In other words, the material of the conductive pillar 412 is same as the material of the conductive ring 414. However, in an alternative embodiment, the conductive pillar 412 and the conductive ring 414 are formed from different conductive layers (not shown), and thus the material of the conductive pillar 412 is different from the material of the conductive ring 414.

In operation 118, the planarizing process also can be seen as a portion of the conductive layer 410 is removed to expose the upper surface S1 of the first dielectric layer 220. Further, the conductive layer 410 may be planarized by chemical mechanical polishing (CMP) process. In one embodiment, after planarization, the conductive pillar 412 has a surface S3 coplanar with the upper surface S1 of the first dielectric layer 220, and the conductive ring 414 has a surface S4 coplanar with the upper surface S1 of the first dielectric layer 220. In another embodiment, after planarization, the conductive pillar 412 has a concave upper surface and the conductive ring 414 also has a concave upper surface because of dishing. In one embodiment, the first dielectric layer 220 is also thinned during planarization.

In order to further describe the structure of the conductive pillar 412 and the conductive ring 414 from top view, please refer to FIGS. 13A-13D. FIGS. 13A-13D are top views of the conductive pillar 412, the conductive ring 414, and the portion 222 of the first dielectric layer 220 between the conductive pillar 412 and the conductive ring 414 in FIG. 5, in accordance with various embodiments. Because the shapes of the conductive pillar 412 and the conductive ring 414 are determined by the shapes of the first trench T1 and the second trench T2 respectively, the shape of the conductive pillar 412 in top view is same as the shape of the first trench T1 in FIG. 3 in top view, and the shape of the conductive ring 414 in top view is same as the shape of the second trench T2 in FIG. 3 in top view.

Figure 13A:
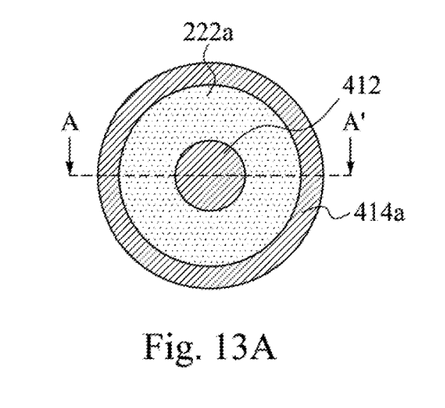
FIGS. 13A-13D are top views of the conductive pillar, the conductive ring, and the portion of the first dielectric layer between the conductive pillar and the conductive ring in FIG. 5, in accordance with various embodiments.
Figure 13B:
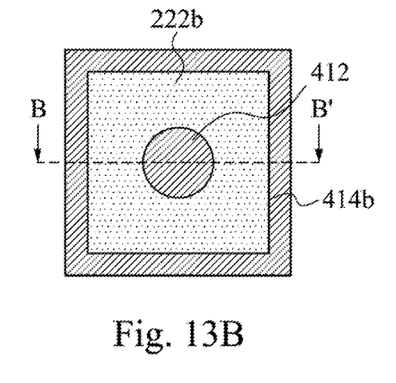
Figure 13C:
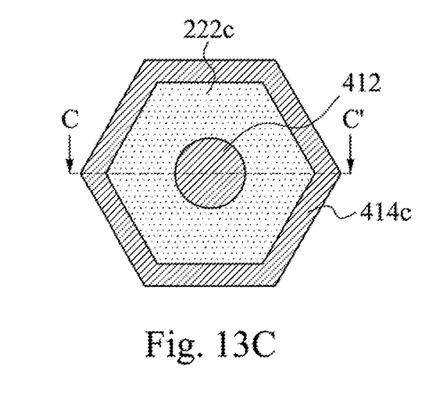
Figure 13D:
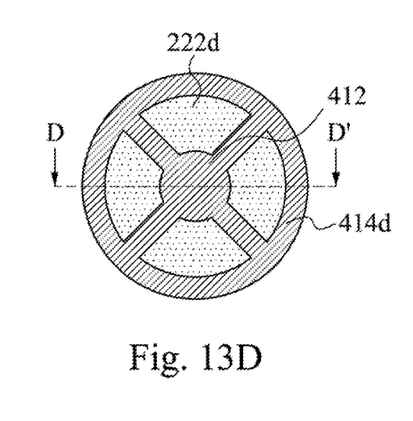

In various embodiments, a region R in FIG. 5 can be seen as a cross-sectional view of FIG. 13A along the line AA', FIG. 13B along the line BB', FIG. 13C along the line CC', or FIG. 13D along the line DD'. Therefore, in different embodiments, the conductive ring 414 in FIG. 5 is a conductive ring 414a shown in FIG. 13A, a conductive ring 414b shown in FIG. 13B, a conductive ring 414c shown in FIG. 13C, or a conductive ring 414d shown in FIG. 13D. Moreover, the portion 222 of the first dielectric layer 220 in FIG. 5 is a portion 222a of the first dielectric layer 220 shown in FIG. 13A, a portion 222b of the first dielectric layer 220 shown in FIG. 13B, a portion 222c of the first dielectric layer 220c shown in FIG. 13C, or a portion 222d of the first dielectric layer 220 shown in FIG. 13D.

As shown in FIG. 13A, the portion 222a surrounds the conductive pillar 412 to separate the conductive pillar 412 and the conductive ring 414a. The conductive ring 414a is circular ring-shaped. In another embodiment, the conductive ring is irregular ring-shaped or polygonal ring-shaped, such as triangular ring-shaped, quadrilateral ring-shaped, pentagonal ring-shaped, hexagonal ring-shaped, and so on. For instance, as shown in FIG. 13B, the conductive ring 414b is quadrilateral ring-shaped. As shown in FIG. 13C, the conductive ring 414c is hexagonal ring-shaped. Further, as shown in FIG. 13D, a conductive connector 413 is between the conductive pillar 412 and the conductive ring 414. The portion 222d of the first dielectric layer 220 surrounds the conductive pillar 412 to separate the conductive pillar 412 and the conductive ring 414d; however, the conductive connector 413 connects the conductive pillar 412 and the conductive ring 414d. Moreover, the conductive connector 413 is also embedded in the first dielectric layer 220.

Figure 6:
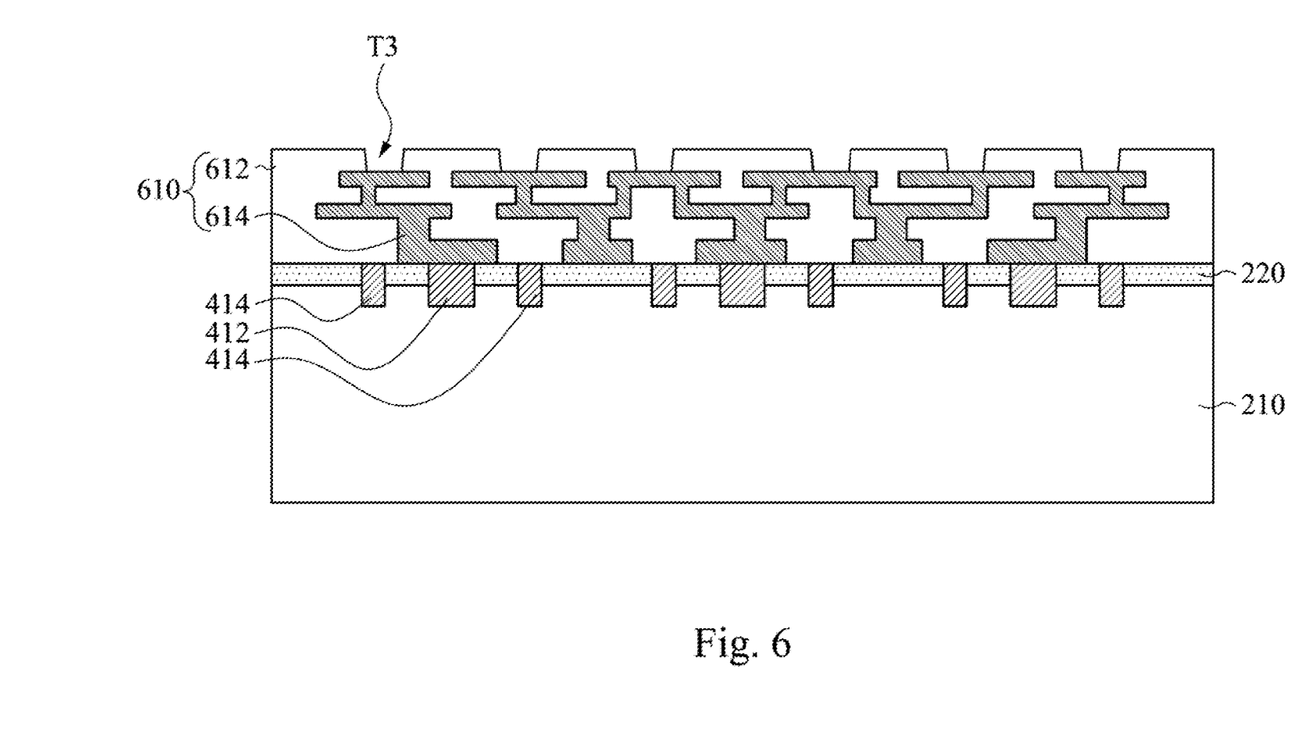

In operation 120, a redistribution layer 610 which includes a second dielectric layer 612 and an interconnect structure 614 is formed on the upper surface S1 of the first dielectric layer 220 as shown in FIG. 6. The second dielectric layer 612 may include multiple dielectric layers, and the interconnect structure 614 may include multiple metal layers.

As shown in FIG. 6, the conductive pillar 412 penetrates through the first dielectric layer 220 and is disposed in contact with the interconnect structure 614. Therefore, the conductive pillar 412 is electrically connected to the interconnect structure 614. However, the conductive ring 414 penetrates through the first dielectric layer 220 and is disposed in contact with the second dielectric layer 612. In one embodiment, the conductive ring 414 is electrically insulated to the interconnect structure 614. However, in an alternative embodiment, the inter-distance between the conductive ring 414 and the conductive pillar 412 is smaller, such that the conductive ring 414 penetrating through the first dielectric layer 220 is disposed in contact with the interconnect structure 614.

Further, as shown in FIG. 6, the redistribution layer 610 has a pad opening T3 to expose the interconnect structure 614 embedded in the second dielectric layer 612.

Figure 7:
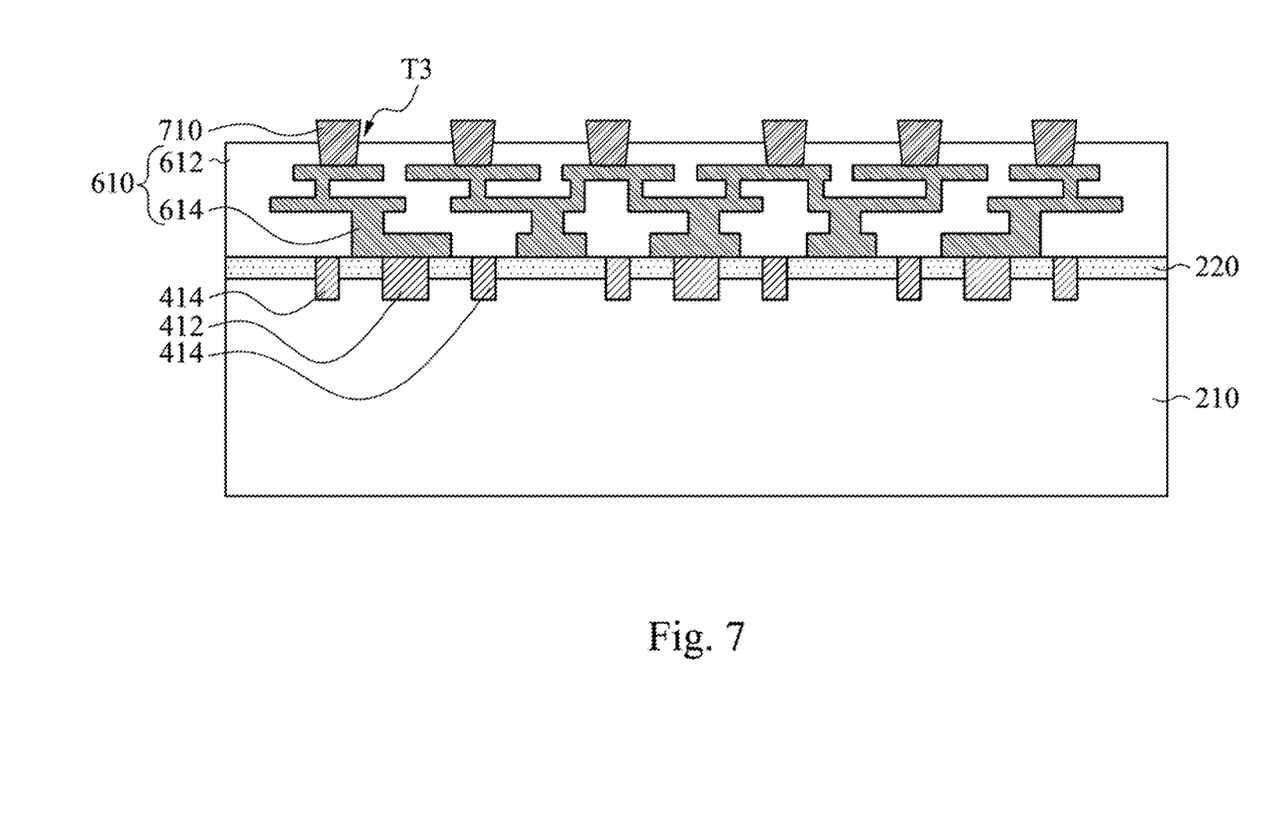

In operation 122, a microbump 710 is formed on the redistribution layer 610 as shown in FIG. 7. More specifically, the microbump 710 is formed in the pad opening T3 in the second dielectric layer 612. Because the interconnect structure 614 is exposed through the pad opening T3, the microbump is disposed in contact with the interconnect structure 614. As shown in FIG. 7, the microbump 710 is partially embedded in the redistribution layer 610 and protrudes from the upper surface of the redistribution layer 610. The protruding portion of microbump 710 is used to connect to a chip.

Figure 8:
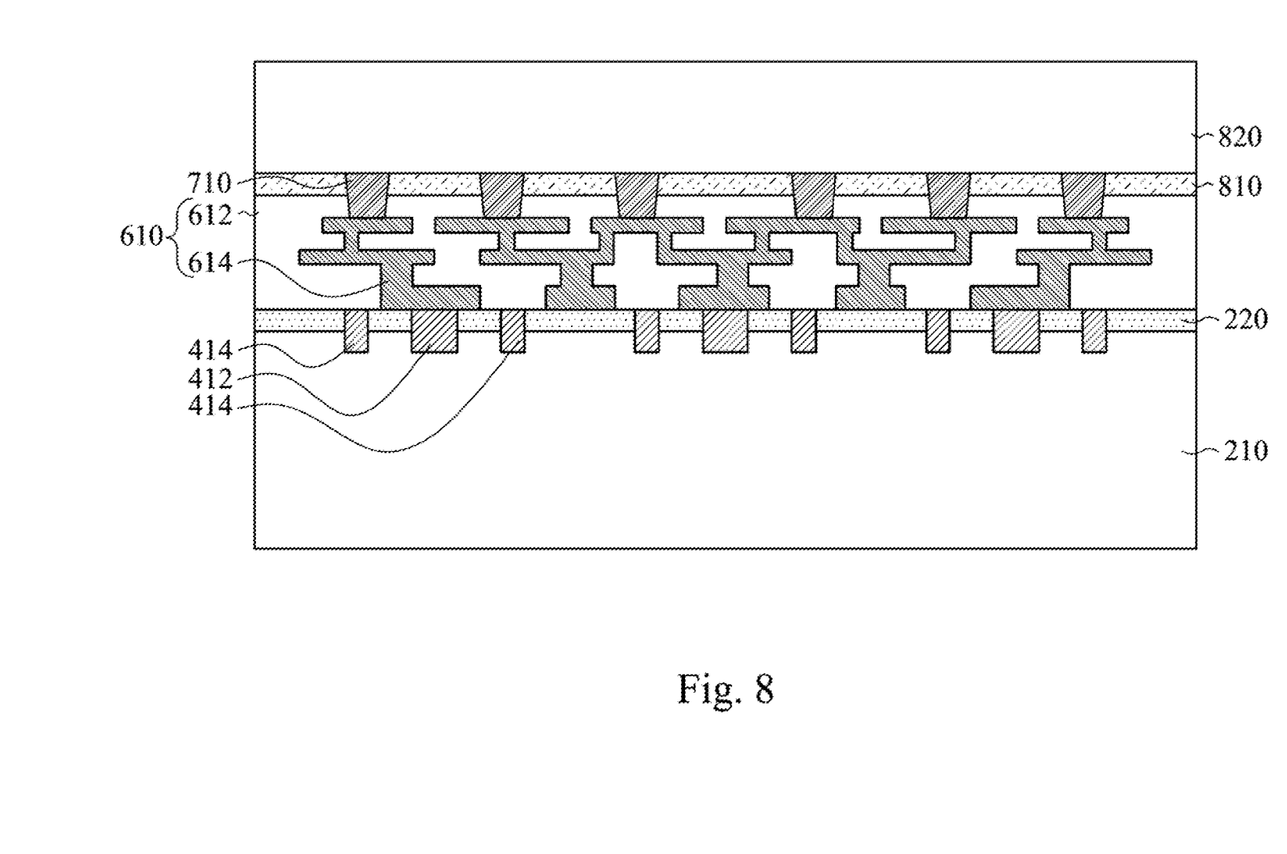

In operation 124, a carrier layer 820 is adhered on the microbump 710 and the redistribution layer 610 by an adhesion layer 810 as shown in FIG. 8. For instance, the carrier layer 820 is a glass substrate, metal substrate, Si substrate, or ceramic substrate.

Figure 9:
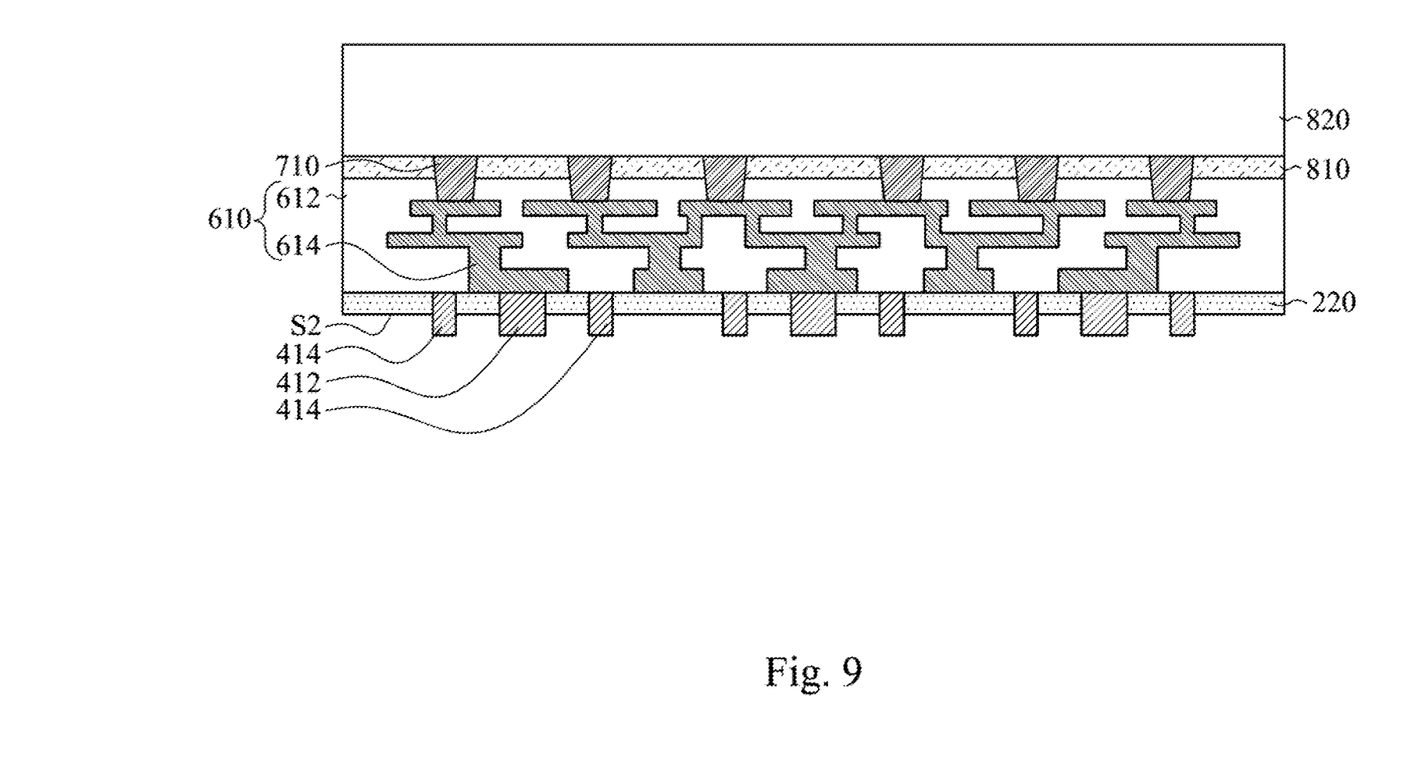

In operation 126, the substrate 210 is removed to expose a portion of the conductive pillar 412 and a portion of the conductive ring 414 as shown in FIG. 9. In one embodiment, the removing operation may include two sub-steps. Firstly, the substrate 210 is thinned by any suitable process, such as grinding. Secondly, the remaining portion of the substrate 210 may be removed by etching process, such as wet etching.

As shown in FIG. 9, the exposed portion of the conductive pillar 412 can be seen as a portion of the conductive pillar 412 protruding from the lower surface S2 of the first dielectric layer 220, and the exposed portion of the conductive ring 414 can be seen as a portion of the conductive ring 414 protruding from the lower surface S2 of the first dielectric layer 220.

Figure 10:
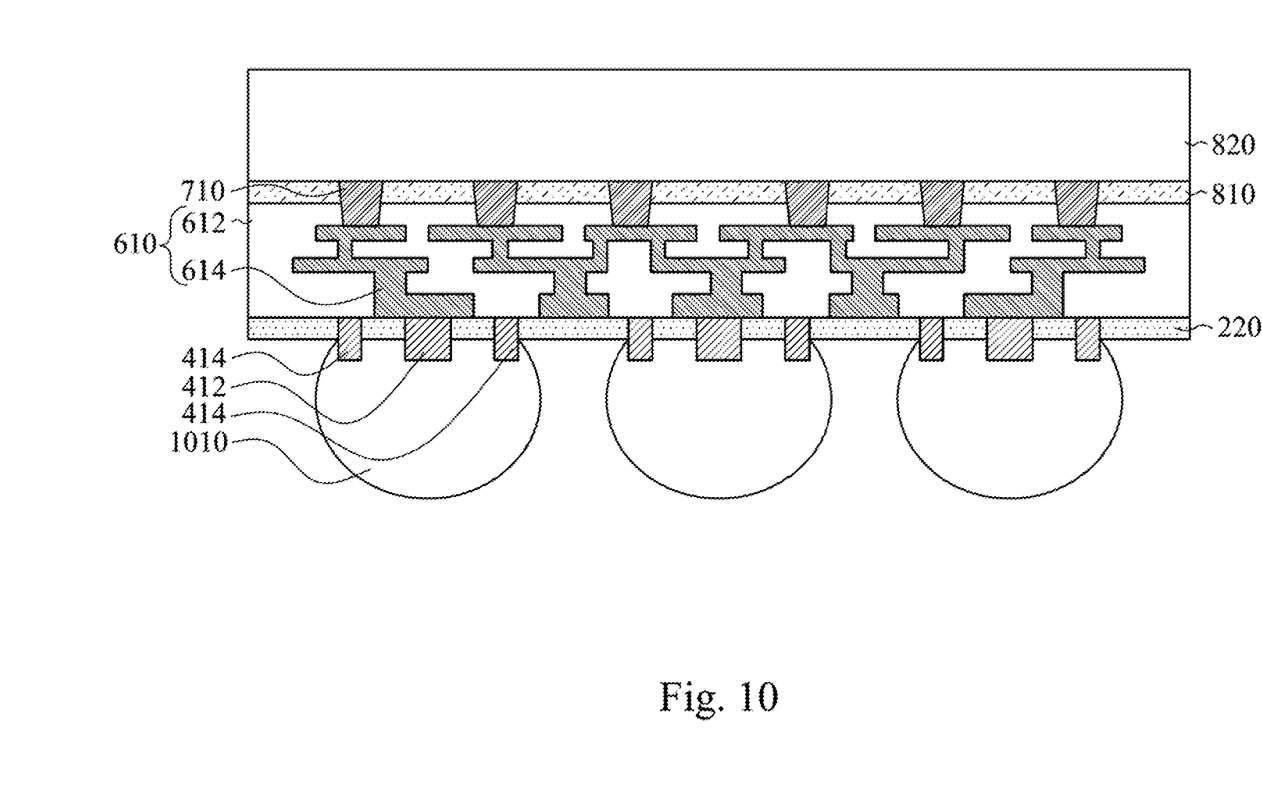

In operation 128, a solder bump 1010 is formed to surround the portion of the conductive pillar 412 and the portion of the conductive ring 414 as shown in FIG. 10. More specifically, the solder bump 1010 is disposed on the lower surface S2 of the first dielectric layer 220, and the portion of the conductive pillar 412 protruding from the lower surface S2 and the portion of the conductive ring 414 protruding from the lower surface S2 are embedded in the solder bump 1010. The conductive ring 414 can help the conductive pillar 412 to support the solder bump 1010, such that the solder bump 1010 can be firmly attached to the conductive pillar 412 and the conductive ring 414. In one embodiment, the solder bump 1010 includes but is not limited to Sn—Pb, Sn—Ag, or Au.

Further, form the operation 128, it can be seen that it is unnecessary to form an opening in the redistribution layer 610 when forming the solder bump 1010 to connect with the interconnect structure 614, because the conductive pillar 412 and the conductive ring 414, which are used for connecting the interconnect structure 614 and the solder bump 1010, are formed previously.

Figure 11:
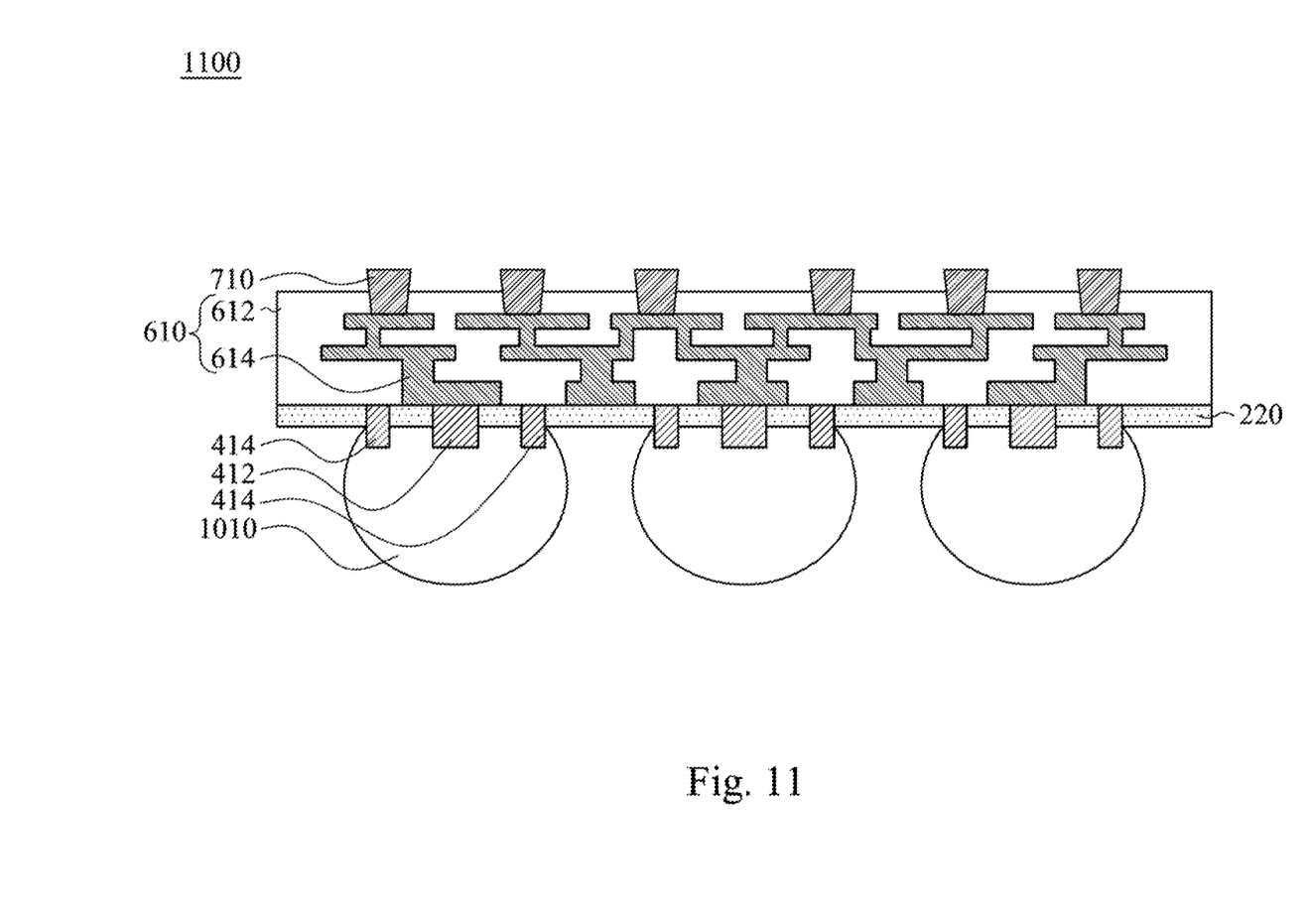

In operation 130, the adhesion layer 810 and the carrier layer 820 are removed to form the interposer 1100 as shown in FIG. 11. The interposer includes the first dielectric layer 220, the conductive pillar 412, the conductive ring 414, the solder bump 1010, the redistribution layer 610, and the microbump 710. The first dielectric layer 220 has the upper surface S1 and the lower surface S2. The conductive pillar 412 is partially embedded in the first dielectric layer 220, and a portion of the conductive pillar 412 protrudes from the lower surface S2 of the first dielectric layer 220. The conductive ring 414 is partially embedded in the first dielectric layer 220 and surrounds the conductive pillar 412, and a portion of the conductive ring 414 protrudes from the lower surface S2 of the first dielectric layer 220. The solder bump 1010 is disposed on the lower surface S2 of the first dielectric layer 220, wherein the portion of the conductive pillar 412 and the portion of the conductive ring 414 are embedded in the solder bump 1010. The redistribution layer 610 is disposed on the upper surface S1 of the first dielectric layer 220 and includes the second dielectric layer 612 and the interconnect structure 614 embedded in the second dielectric layer 612. The microbump 710 is disposed on the redistribution layer 610 and is disposed in contact with the interconnect structure 614.

Figure 12:
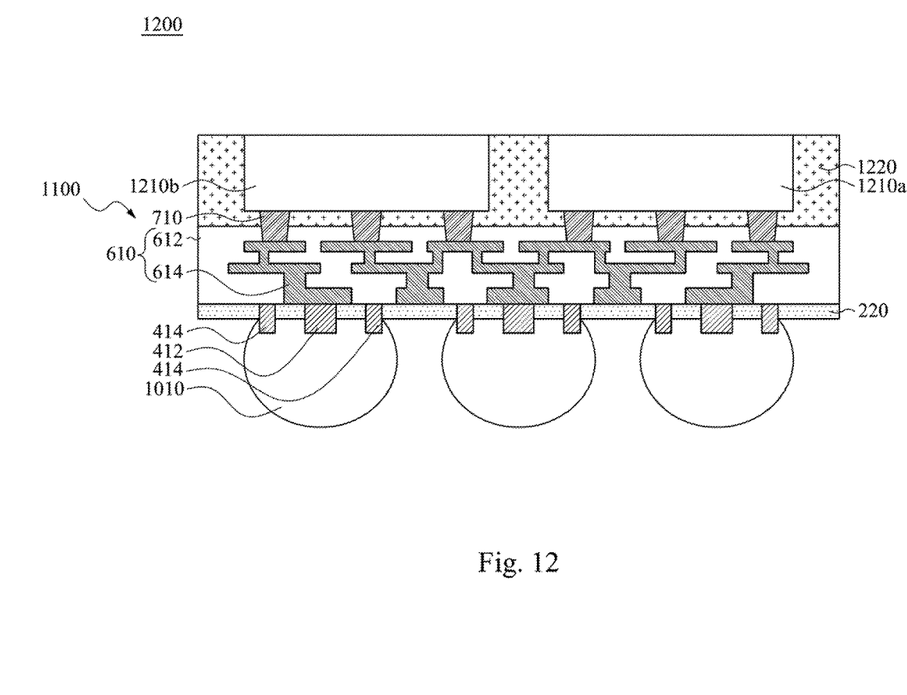
FIG. 12 is a cross-sectional view of a semiconductor package, in accordance with various embodiments.

FIG. 12 is a cross-sectional view of a semiconductor package 1200, in accordance with various embodiments. The semiconductor package 1200 includes the interposer 1100 shown in FIG. 11, a chip 1210*a*, a chip 1210*b*, and a molding compound 1220. The chip 1210*a* and the chip 1210*b* are disposed on the microbump 710 of the interposer 1100. The molding compound 1220 surrounds the chip 1210*a*, the chip 1210*b*, the microbump 710, and the second dielectric layer 612 for encapsulating the chip 1210*a* and the chip 1210*b*. In one embodiment, the semiconductor package 1200 includes either the chip 1210*a* or the chip 1210*b*. In one embodiment, the type of the chip 1210*a* is same as the chip 1210*b*. In another embodiment, the type of the chip 1210*a* is different from the chip 1210*b*. In one embodiment, the chip 1210*a* and the chip 1210*b* can be further connected to a package substrate, such as printed circuit board (PCB), by the interposer 1100 for mounting onto the package substrate. In other words, the solder bump 1010 of the interposer 1100 can connect to a package substrate, and thus the interposer 1100 can provides connectivity between the chip 1210*a*, the chip 1210*b*, and the package substrate.

Given above, the interposer of the present disclosure including the conductive pillar for connecting the interconnect structure and the solder bump, and the conductive ring for supporting the solder bump at least has the following advantages. The conductive pillar and the conductive ring are bonded with the solder bump simultaneously, and therefore providing large contact areas to contact the solder bump. In other words, when the conductive pillar electrically connects the interconnect structure and the solder bump, the conductive ring can help the conductive pillar to support the solder bump, and thus the solder bump can be firmly attached to the conductive pillar and the conductive ring. The semiconductor package of the present disclosure including the interposer would also have the above advantages.

Although the present disclosure has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present disclosure without departing from the scope or spirit of the disclosure. In view of the foregoing, it is intended that the present disclosure cover modifications and variations of this disclosure provided they fall within the scope of the following claims.

What is claimed is:

1. An interposer, comprising:
   a first dielectric layer having an upper surface and a lower surface;
   a conductive pillar partially embedded in the first dielectric layer, and a portion of the conductive pillar protruding from the lower surface of the first dielectric layer;
   a conductive ring partially embedded in the first dielectric layer, the conductive ring surrounding the conductive pillar, and a portion of the conductive ring protruding from the lower surface of the first dielectric layer;
   a solder bump on the lower surface of the first dielectric layer, wherein the portion of the conductive pillar and the portion of the conductive ring are embedded in the solder bump; and
   a redistribution layer disposed on the upper surface of the first dielectric layer.

2. The interposer of claim 1, wherein a portion of the first dielectric layer surrounds the conductive pillar to separate the conductive pillar and the conductive ring.

3. The interposer of claim 1, further comprising a conductive connector embedded in the first dielectric layer, wherein the conductive connector connects the conductive pillar and the conductive ring.

4. The interposer of claim 1, wherein a material of the conductive pillar is same as a material of the conductive ring.

5. The interposer of claim 1, wherein the redistribution layer comprises a second dielectric layer and an interconnect structure embedded in the second dielectric layer.

6. The interposer of claim 5, wherein the conductive pillar penetrates through the first dielectric layer and is disposed in contact with the interconnect structure.

7. The interposer of claim 5, wherein the conductive ring penetrates through the first dielectric layer and is disposed in contact with the second dielectric layer.

8. The interposer of claim 5, wherein the conductive ring penetrates through the first dielectric layer and is disposed in contact with the interconnect structure.

9. The interposer of claim 5, further comprising a microbump disposed on the redistribution layer, wherein the microbump is disposed in contact with the interconnect structure.

10. The interposer of claim 1, wherein the conductive pillar has a surface coplanar with the upper surface of the first dielectric layer.

11. The interposer of claim 1, wherein the conductive ring has a surface coplanar with the upper surface of the first dielectric layer.

12. The interposer of claim 1, wherein a first height of the conductive pillar is larger than, equal to, or smaller than a second height of the conductive ring.

13. The interposer of claim 1, wherein a height of the conductive ring is larger than a thickness of the first dielectric layer.

14. The interposer of claim 1, wherein the conductive ring is circular ring-shaped, polygonal ring-shaped, or irregular ring-shaped.

15. The interposer of claim 1, wherein a material of the conductive pillar comprises copper, chromium, nickel, aluminum, gold, silver, tungsten, titanium, tin, platinum, palladium, titanium nitride (TIN), titanium tungsten (TiW), nickel vanadium (NiV), or chromium copper (CrCu).

16. The interposer of claim 1, wherein a material of the conductive ring comprises copper, chromium, nickel, aluminum, gold, silver, tungsten, titanium, tin, platinum, palladium, titanium nitride (TIN), titanium tungsten (TiW), nickel vanadium (NiV), or chromium copper (CrCu).

17. A semiconductor package, comprising:
the interposer of claim 1;
a microbump disposed on the redistribution layer; and
a chip disposed on the microbump, wherein the redistribution layer comprises a second dielectric layer and an interconnect structure embedded in the second dielectric layer, and the microbump is disposed in contact with the interconnect structure.

18. The semiconductor package of claim 17, wherein a portion of the first dielectric layer surrounds the conductive pillar to separate the conductive pillar and the conductive ring.

19. The semiconductor package of claim 17, further comprising a conductive connector embedded in the first dielectric layer, wherein the conductive connector connects the conductive pillar and the conductive ring.

20. The semiconductor package of claim 17, wherein the conductive ring penetrates through the first dielectric layer and is disposed in contact with the second dielectric layer.

* * * * *

UNITED STATES PATENT AND TRADEMARK OFFICE
CERTIFICATE OF CORRECTION

PATENT NO. : 9,922,924 B1
APPLICATION NO. : 15/369834
DATED : March 20, 2018
INVENTOR(S) : Shing-Yih Shih Page 1 of 1

It is certified that error appears in the above-identified patent and that said Letters Patent is hereby corrected as shown below:

On the Title Page

In ITEM (72) Inventor:  change "Shing-Yih Shih, New Taipei (TW)"
to --Shing-Yih SHIH, New Taipei City (TW)--

In ITEM (63) Related U.S. Application Data:  change "Continuation-in-part of application No. 15/342,124, filed on Nov. 3, 2016."
to --Continuation-in-part of application No. 15/342,124, filed on Nov. 3, 2016, now Pat. App. 9,922,845.--

In the Specification

Column 4,   Line 32,   change "titanium nitride (TIN),"
to --titanium nitride (TiN),--

In the Claims

Claim 15,   Column 9,   Line 13,   change "titanium nitride (TIN),"
to --titanium nitride (TiN),--

Signed and Sealed this
First Day of May, 2018

Andrei Iancu
*Director of the United States Patent and Trademark Office*